United States Patent [19]

Furihata et al.

[11] Patent Number: 5,618,892
[45] Date of Patent: Apr. 8, 1997

[54] 2,4-DIAMINO-S-TRIAZINYL GROUP-CONTAINING POLYMER AND NEGATIVE RADIATION-SENSITIVE RESIST COMPOSITION CONTAINING THE SAME

[75] Inventors: Tomoyoshi Furihata; Motoyuki Yamada, both of Kawasaki, Japan

[73] Assignee: Shin-Etsu Chemical Co., Ltd., Tokyo, Japan

[21] Appl. No.: 561,625

[22] Filed: Nov. 21, 1995

[30] Foreign Application Priority Data

Nov. 22, 1994 [JP] Japan .................................. 6-312434
Nov. 22, 1994 [JP] Japan .................................. 6-312435
Jul. 25, 1995 [JP] Japan .................................. 7-209075

[51] Int. Cl.[6] ............................ C08F 283/00; C08G 8/28
[52] U.S. Cl. ..................... 525/483; 525/480; 430/270.11
[58] Field of Search .................................. 525/480, 483; 430/270

[56] References Cited

U.S. PATENT DOCUMENTS 5,506,279 4/1996 Babu et al. ............................... 522/34
5,510,233 4/1996 Nakanishi et al. ....................... 430/535

Primary Examiner—Samuel A. Acquah
Attorney, Agent, or Firm—Millen, White, Zelano, & Branigan, P.C.

[57] ABSTRACT

A polyhydroxystyrene having a 2,4-diamino-s-triazinyl group substituted for 1–50 mol % of its hydroxyl group and a weight average molecular weight of 3,000–50,000 is provided. A negative radiation-sensitive resist composition comprising the polymer, preferably along with a photo-acid generator and a crosslinking agent has high resolution and developability, affords a resist pattern of rectangular profile, and is shelf stable. The composition is thus very useful as resist material for LSI manufacture.

2 Claims, 4 Drawing Sheets

2,4-DIAMINO-S-TRIAZINYL GROUP-CONTAINING POLYMER AND NEGATIVE RADIATION-SENSITIVE RESIST COMPOSITION CONTAINING THE SAME

BACKGROUND OF THE INVENTION

1. Field of the Invention

This invention relates to a novel polymer capable of producing a resist pattern having improved resolution, developability and resist pattern profiling in fine processing, having improved shelf stability and useful as a base polymer for ULSI resist material, as well as a negative radiation-sensitive resist composition comprising the polymer as a base polymer.

2. Prior Art

Functional polymers are widely used as base polymers for resist materials which are utilized in high resolution lithography in the manufacture of LSI. A demand for higher resolution and developability is imposed on the resist material to cope with the recent advances in fine processing technology and the increasing degree of integration.

To meet the demand, as long as negative radiation-sensitive resist compositions are concerned, active research works have focused on a three component system comprising an alkali-soluble base polymer, a photo-acid generator capable of generating an acid upon exposure to radiation, and a crosslinking agent capable of causing crosslinking of the base polymer molecules by interacting with the acid. Typical alkali-soluble base polymers used heretofore are novolak resins, polyvinyl phenol derivatives, and N-(p-Hydroxyphenyl)maleimide polymers. Typical photo-acid generators used heretofore are 2,4,6-Tris(trihalomethyl)-s-triazine, 2,4,6-Tris(2,3-dibromopropyl)isocyanurate, and onium salts. Typical crosslinking agents used heretofore are Hexaalkylolmelaminehexamethylethers, Tetraalkoxymethylureas, Dialkoxymethylglycolureas, and dialkoxymethylpropylene ureas.

Resist compositions of the three component system, however, have the following problem. Crosslinking agents, typically Hexamethylolmelaminehexamethylether and Tetramethoxymethylurea are generally difficult to purify and inevitably contain noticeable amounts of impurities in the form of di- to penta-methoxymethylated derivatives. For example, Hexamethylolmelaminehexamethylether contains such impurities as 2,4-(N-Methoxymethyl)amino-6-amino-1,3,5-triazine, 2,4,6-(N-Methoxymethyl)amino-1,3,5-triazine, 2,4-(N-Methoxymethyl)amino-6-(N,N-dimethoxymethyl)amino-1,3,5-triazin and 2,4-(N,N-Dimethoxymethyl)amino-6-(N-methoxymethyl)amino-1,3,5-triazine. If any one of these agents is used alone as a compound having a substituent capable of crosslinking with the aid of an acid, the concomitant impurities can cause striation by exacerbating the compatibility with the base polymer upon formulation of a resist composition, reduce contrast upon fine processing, allow unexposed portions of resist film to be left after development, degrade a resist pattern profile, and detract from the shelf stability of the resist composition itself.

There is a need to have a resist composition which can overcome the above-mentioned problems and has higher resolution and developability.

SUMMARY OF THE INVENTION

An object of the present invention is to provide a novel polymer capable of producing a resist pattern having improved resolution, developability and resist pattern profiling in fine processing, having improved shelf stability and useful as a base polymer for resist material. Another object is to provide a negative radiation-sensitive resist composition comprising the polymer as a base polymer.

In order to develop a functional polymer capable of achieving the above and other objects, we made investigation on polystyrene derivatives. We have found that a polymer consisting of units of the structural formulae (1a) and (1b) shown below is an effective base polymer for a resist composition.

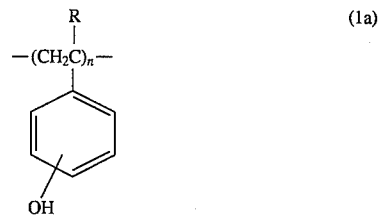

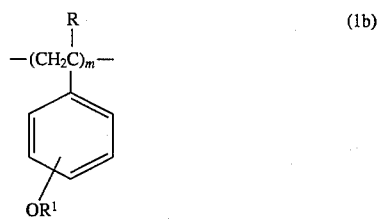

In the formulae, R is a hydrogen atom or methyl group, $R^1$ is a 2,4-diamino-s-triazinyl group of the following structural formula (2):

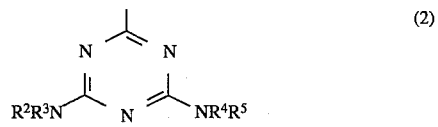

wherein at least one of $R^2$, $R^3$, $R^4$, and $R^5$ is an alkoxymethyl group of the following structural formula (3): —$CH_2OR^6$ wherein $R^6$ is an alkyl group having 1 to 4 carbon atoms, and the remainder of $R^2$, $R^3$, $R^4$, and $R^5$ is a hydrogen atom. From a negative radiation-sensitive resist composition comprising the polymer as a base polymer and a compound capable of releasing an acid upon exposure to radiation and a similar resist composition further comprising a crosslinking agent or compound having a substituent capable of interacting with the acid for crosslinking, resist patterns having a rectangular profile can be produced with improved resolution and developability. These resist compositions are shelf stable. Because of these improved features, the compositions are useful as LSI resist material. The latter composition maintains its ability even when it uses crosslinking agents which are likely to contain impurities, typically Hexamethylolmelaminehexamethylether and Tetramethoxymethylurea.

In a first aspect, the present invention provides a 2,4-diamino-s-triazinyl group-containing polymer consisting of 99 to 50 mol % of a unit of structural formula (1a) and 1 to 50 mol % of a unit of structural formula (1b) and having a weight average molecular weight of 3,000 to 50,000.

In a second aspect, the present invention provides a negative radiation-sensitive resist composition comprising the polymer as a base polymer. The composition may further contain a compound capable of releasing an acid upon exposure to radiation, or the composition may further contain a compound capable of releasing an acid upon exposure to radiation and a compound having a substituent capable of interacting with the acid for crosslinking.

DETAILED DESCRIPTION OF THE INVENTION

DETAILED DESCRIPTION OF THE INVENTION

Figure 1:
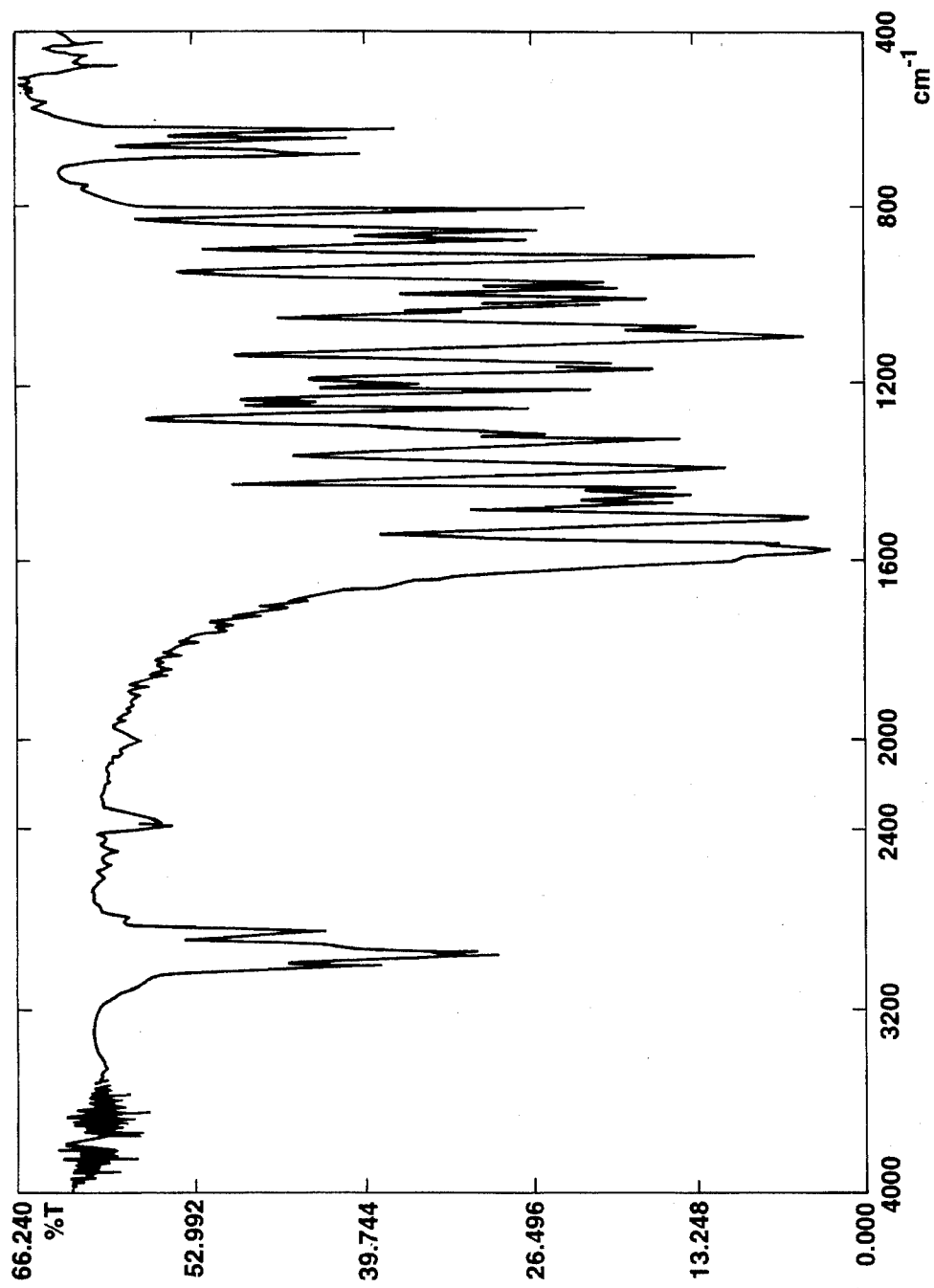
FIG. 1 is an IR spectrum of the compound obtained in Reference Example.

The polymer of the present invention is an alkali-soluble polymer consisting of units of the structural formulae (1a) and (1b).

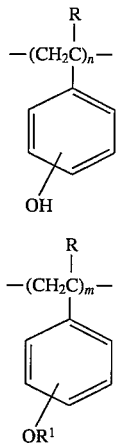

In formulae (1a) and (1b), R is a hydrogen atom or methyl group. $R^1$ is a 2,4-diamino-s-triazinyl group of the following structural formula (2).

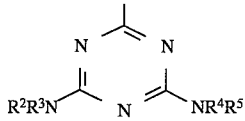

In formula (2), at least one of $R^2$, $R^3$, $R^4$, and $R^5$, preferably at least $R^2$ and $R^4$, more preferably each of $R^2$, $R^3$, $R^4$, and $R^5$, is an alkoxymethyl group of the following structural formula (3): —$CH_2OR^6$ wherein $R^6$ is an alkyl group having 1 to 4 carbon atoms. The remainder of $R^2$, $R^3$, $R^4$, and $R^5$, if any, is a hydrogen atom.

The polymer contains units of the structural formulae (1a) and (1b) such that the formula (1a) unit occupies 99 to 50 mol %, especially 99 to 90 mol % of the entire polymer and the formula (1b) unit occupies 1 to 50 mol %, especially 1 to 10 mol % of the entire polymer. If the content of the formula (1b) unit is below the range, there arises a problem that a resist composition containing such a polymer as the base polymer undergoes a less extent of crosslinking between polymer molecules in the steps of radiation exposure and post-exposure baking, losing control of film thinning during development. If the content of the formula (1b) unit is beyond the range, there arises a problem that uncontrollable crosslinking reaction takes place and the solubility of unexposed portions in the developer is uncontrollable.

The polymer has a weight average molecular weight (Mw) of 3,000 to 50,000, especially 3,000 to 20,000. The distribution of molecular weight of the polymer should preferably be narrow since it largely dictates the developing properties and resolution of a resist material based on the polymer. That is, the polymer should preferably be a low dispersity polymer. The polymer should preferably have a molecular weight dispersity of 1.0 to 1.4, more preferably 1.03 to 1.2, most preferably 1.03 to 1.1. The term molecular weight dispersity denotes Mw/Mn wherein Mw is a weight average molecular weight and Mn is a number average molecular weight.

The polymer can be produced, for example, by effecting dehydrochlorination reaction between low dispersity polyhydroxystyrene resulting from living polymerization and 2,4-Diamino-6-chloro-s-triazine of the following structural formula (4):

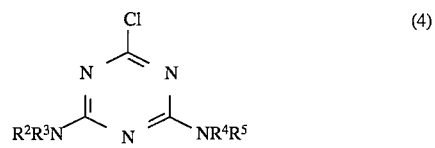

wherein $R^2$, $R^3$, $R^4$, and $R^5$ are as defined above.

Polyhydroxystyrene which is one of the reactants used herein is not limited to living polymerized one. However, it is advantageous to synthesize a polymer using a living polymerized polyhydroxystyrene when the polymer is used as a base polymer for a resist material whose developing properties and resolution are largely dictated by the molecular weight and molecular weight dispersity of the polymer as mentioned above. This is because living polymerization often results in a low dispersity polyhydroxystyrene having a weight average molecular weight of 3,000 to 50,000, especially 3,000 to 20,000 and a dispersity Mw/Mn of 1.0 to 1.4, especially 1.03 to 1.2, most preferably 1.03 to 1.1.

The other reactant, 2,4-Diamino-6-chloro-s-triazine of formula (4) is preferably used in such amounts that triazinyl groups may substitute for 1 to 50 mol %, especially 1 to 10 mol % of the hydroxyl groups in the polyhydroxystyrene.

Dehydrochlorination reaction may be effected in a conventional manner, preferably using a catalyst such as tert-butoxy potassium in the presence of a solvent such as dimethyl sulfoxide. The preferred reaction conditions include 10 to 30 hours at room temperature, especially one day at room temperature.

The compound of formula (4) can be synthesized by N-Hydroxymethylation reaction of 2,4-Diamino-6-halo-1,3, 5-triazine of the following structural formula (5), followed by alkoxylation reaction.

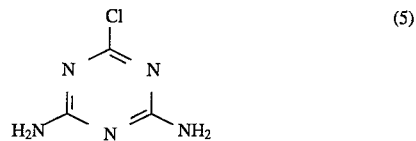

N-Hydroxymethylation of the compound of formula (5) may be accomplished by reacting the compound of formula (5) with formaldehyde. Preferably 4 to 20 mol, especially 10 to 20 mol of formaldehyde is used per mol of the compound of formula (5). The reaction is preferably effected under basic conditions of pH 8 to 10, especially pH 9 to 10. The reaction may be effected by dissolving the compound of formula (5) in a formaldehyde aqueous solution, typically at a temperature of 10° to 50° C., especially 20° to 40° C. The reaction time is usually about 30 minutes to one hour.

The subsequent alkoxylation reaction may be effected by adding a lower alcohol to the resulting N-hydroxymethylated compound and heating the reaction mixture at a temperature of 40° to 80° C., especially 60° to 70° C. The reaction may be effected under acidic conditions of pH 2 to 6, especially pH 3 to 4. The reaction time is usually about 30 minutes to one hour. Preferably 4 to 20 mol, especially 10 to 20 mol of lower alcohol is used per mol of the N-hydroxymethyl group.

In the second aspect, the present invention provides a negative radiation-sensitive resist composition comprising the polymer of formula (1) as an alkali-soluble base polymer. Preferred embodiments contemplated herein are (A) a composition comprising the alkali-soluble base polymer and an acid generator or compound capable of releasing an acid upon exposure to radiation and (B) a composition comprising the alkali-soluble base polymer, an acid generator or compound capable of releasing an acid upon exposure to radiation, and a crosslinking agent or compound having a substituent capable of interacting with the acid for crosslinking. In both the embodiments, the polymer of formula (1) is used as the alkali-soluble base polymer. The negative radiation-sensitive resist composition (A) comprising the alkali-soluble base polymer and an acid generator or compound capable of releasing an acid upon exposure to radiation provides a resist coating of the negative working type wherein the polymer molecules are crosslinked with the acid released upon exposure to radiation.

In both the compositions (A) and (B), the polymer is desirably blended in an amount of 1 to 50% by weight, especially 5 to 20% by weight of the entire composition. Less than 1% by weight of the polymer would be insufficient as the base polymer. More than 50% by weight of the polymer would prevent the composition from being uniformly coated onto a wafer to form a resist film.

The acid generator used herein may be selected from well-known ones, for example, onium salts such as diphenyl Iodonium salts, Triphenyl sulfonium salts, and Phenyl diazonium salts; Tosylates (or p-toluenesulfonic acid esters) such as Benzyl tosylate, nitrobenzyl tosylate, and dinitrobenzyl tosylate; sulfonyl compounds such as benzyl solfonate, nitrobenzyl sulfonate, and dinitrobenzyl sulfonate; halomethylated triazine compounds such as 2,4,6-tris-(trichloromethyl)-s-triazine, 2,4,6-tris(tribromo-methyl)-s-triazine, and 2,4-bis(trichloromethyl)-6-p-trimethoxyphenyl-s-triazine; and azide compounds such as o-quinonediazide and 1,2-naphthoquinonediazido-4-sulfonic acid ester.

Desirably the acid generator is blended in an amount of 0.1 to 20% by weight, especially 0.5 to 10% by weight of the entire composition. Less than 0.1% by weight of the acid generator would fail to cause the polymer molecules to crosslink. With more than 20% by weight of the acid generator, a reaction product would precipitate and settle in a resist composition during storage at room temperature.

The compound having a substituent capable of interacting with the acid for crosslinking used in composition (B) may be selected from well-known crosslinking agents. Examples include triazines such as hexamethylolmelamine hexamethyl ether and 2,4-di(N,N-dimethoxymethyl)-6-phenyl-1,3, 5-triazine, and ureas such as tetramethoxymethyl urea, dimethoxymethylglycol urea and dimethoxymethylpropylene urea.

Desirably the crosslinking agent is blended in an amount of 0.5 to 30% by weight, especially 1 to 20% by weight of the entire composition. Less than 0.5% by weight of the crosslinking agent would be short for satisfactory crosslinking reaction to take place. With more than 30% by weight of the crosslinking agent, crosslinking reaction would become uncontrollable.

Where commercially available hexamethylolmelamine hexamethyl ether, tetramethoxymethyl urea and other crosslinking agents containing a relatively large amount of impurities are used, it is recommended to use a base polymer having a relatively high content of triazinyl group and reduce the amount of crosslinking agent blended because the problems of striation, contrast lowering, and film residues can be overcome. More particularly, it is recommended to use a polymer having a triazinyl group substitution of 5 to 20 mol % and limit the amount of crosslinking agent blended to 1 to 5% by weight of the entire composition.

Typically a solvent is further blended in the negative radiation-sensitive resist composition of the invention. By mixing and dissolving the necessary components including the polymer in a solvent, there is obtained a resist liquid. Any desired solvent may be used herein insofar as it has a sufficient ability to dissolve the necessary components including the polymer therein to form a coating solution. Examples include cellosolve solvents such as methyl cellosolve, ethyl cellosolve, methyl cellosolve acetate, and ethyl cellosolve acetate; propylene glycol solvents such as propylene glycol monoethyl ether, propylene glycol monobutyl ether, and propylene glycol monomethyl ether acetate; ester solvents such as butyl acetate, amyl acetate, methyl lactate, ethyl lactate, ethyl 3-methoxypropionate, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; and highly polar solvents such as dimethylformamide and N-methylpyrrolidone, alone or in admixture. Preferably the resist coating solution contains the solvent in an amount of 1 to 20 times the total weight of solids. If necessary, there may be added small amounts of additives such as resins, dyes and surfactants.

A typical process for forming a pattern using the negative radiation-sensitive resist composition of the invention involves coating the composition in solution form to form a resist film of up to 2 µm thick, optionally prebaking, irradiating to the resist film radiation having a wavelength of up to 365 nm, preferably up to 248 nm for exposure, post-exposure baking the resist film preferably at 80° to 130° C. for 1 to 5 minutes, and thereafter developing the resist film with an aqueous alkaline solution. During the process, the polymer molecules crosslink together through the interaction of triazinyl groups in the polymer alone or with the crosslinking agent triggered by the acid released from the acid generator upon exposure to radiation whereby the exposed portions of the resist film become alkali insoluble.

There has been described a 2,4-diamino-s-triazinyl group-containing polymer which is useful as a base polymer of a resist composition. A negative radiation-sensitive resist composition comprising the polymer as a base polymer affords a resist pattern of rectangular profile having high resolution and developability. The composition is fully shelf stable. Therefore the composition is a very useful resist material for LSI manufacture.

EXAMPLE

Examples of the present invention are given below by way of illustration and not by way of limitation. All parts are by weight.

Reference Example

Synthesis of 2,4-bis(N,N-dimethoxymethylamino)-6-chloro-1,3,5-triazine

A 500-ml three-necked flask was charged with 25 g (0.172 mol) of 2,4-diamino-6-chloro-1,3,5-triazine, which was dissolved in 300 g of a 37% formaldehyde aqueous solution (3.44 mol). To the flask was added 5 g of 5N sodium hydroxide aqueous solution. After it was confirmed that the solution reached pH 8 or 9, the solution was heated under reflux for about 30 minutes for hydroxymethylation reaction. Thereafter, the reaction solution was agitated for about 30 minutes at room temperature and concentrated under vacuum to remove the unreacted formalin.

To the concentrate was added 300 ml of methyl alcohol. After the mixture was heated under reflux, 5.5 g of 5N hydrochloric acid was added, and methoxymethylation reaction was effected at the same temperature for 40 minutes. After the completion of reaction, the reaction solution was neutralized with 5N sodium hydroxide aqueous solution. The mixture was concentrated under vacuum to remove the unreacted methyl alcohol. The concentrate was separated and purified through a silica gel column, collecting 30.4 g (yield 54.8%) of 2,4-bis(N,N-dimethoxymethylamino)-6-chloro-1,3,5-triazine as a white solid.

Figure 2:
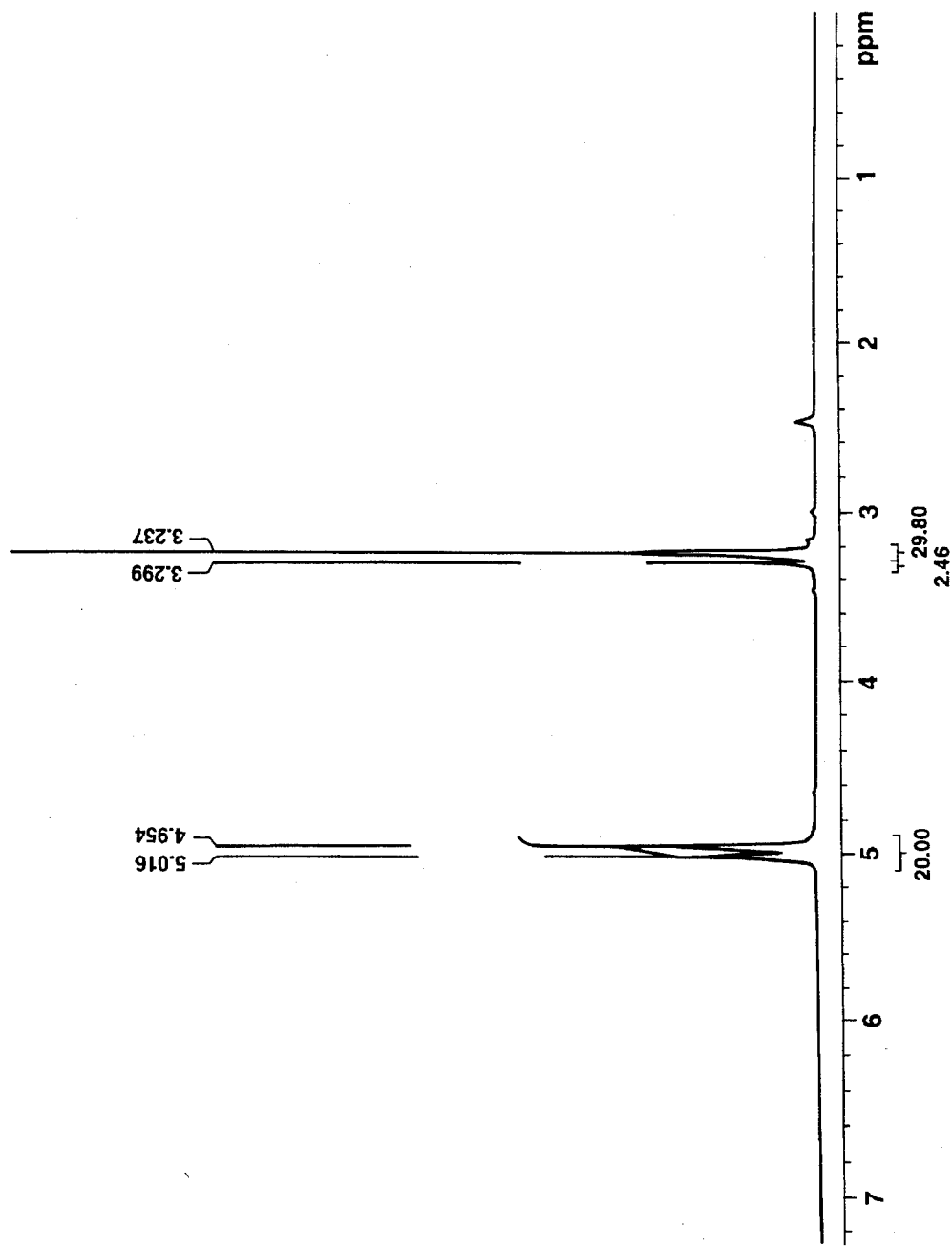
FIG. 2 is a $^1$H-NMR spectrum of the compound obtained in Reference Example.

The end product was analyzed by infrared (IR) absorption spectroscopy and proton-NMR spectroscopy, with the resulting spectra shown in FIGS. 1 and 2, respectively.

IR (KBr, cm$^{-1}$): 2953 (νC—H), 1392 (δC—H), 1099 (νC—O—C), 804 (triazine specific absorption), 662 (C—Cl)

PMR (300 MHz, in DMSO-d6, ppm): 3.24 (s, CH$_3$, 12H), 4.99 (d, —CH$_2$—, 8H)

Example 1

Partial triazinylation reaction of polyhydroxystyrene with 2,4-bis(N,N-dimethoxymethylamino)-6-chloro-1,3,5-triazine A 100-ml three-necked flask was charged with 5 g of a polyhydroxystyrene resulting from living polymerization (Mw =9,500, dispersity Mw/Mn=1.07), which was dissolved in 20 ml of dimethyl sulfoxide. To the flask was added 0.35 g of tert-butoxy potassium. The mixture was agitated at room temperature for about 30 minutes until a uniform solution was obtained. Thereafter 0.67 g of 2,4-bis(N,N-dimethoxymethylamino)-6-chloro-1,3,5-triazine was added in several portions. The mixture was agitated at room temperature for one day and the reaction solution was poured into about 1 liter of water. Re-precipitation was repeated several times for purification. On drying, there was collected 4.5 g of partially triazinylated polyhydroxystyrene (triazinyl substitution 4.2 mol %, yield 81.0%).

Figure 3:
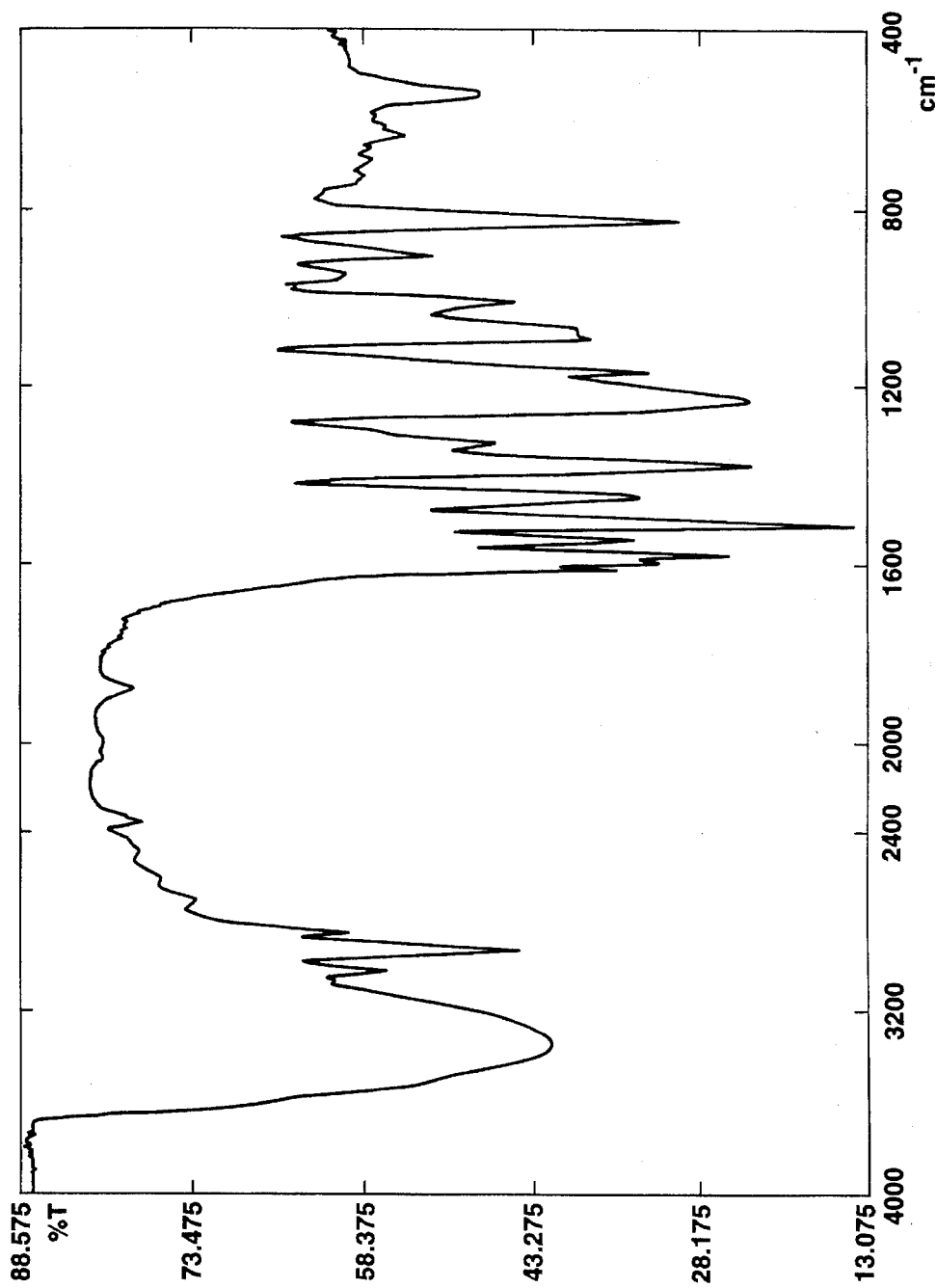
FIG. 3 is an IR spectrum of the compound obtained in Example 1.
Figure 4:
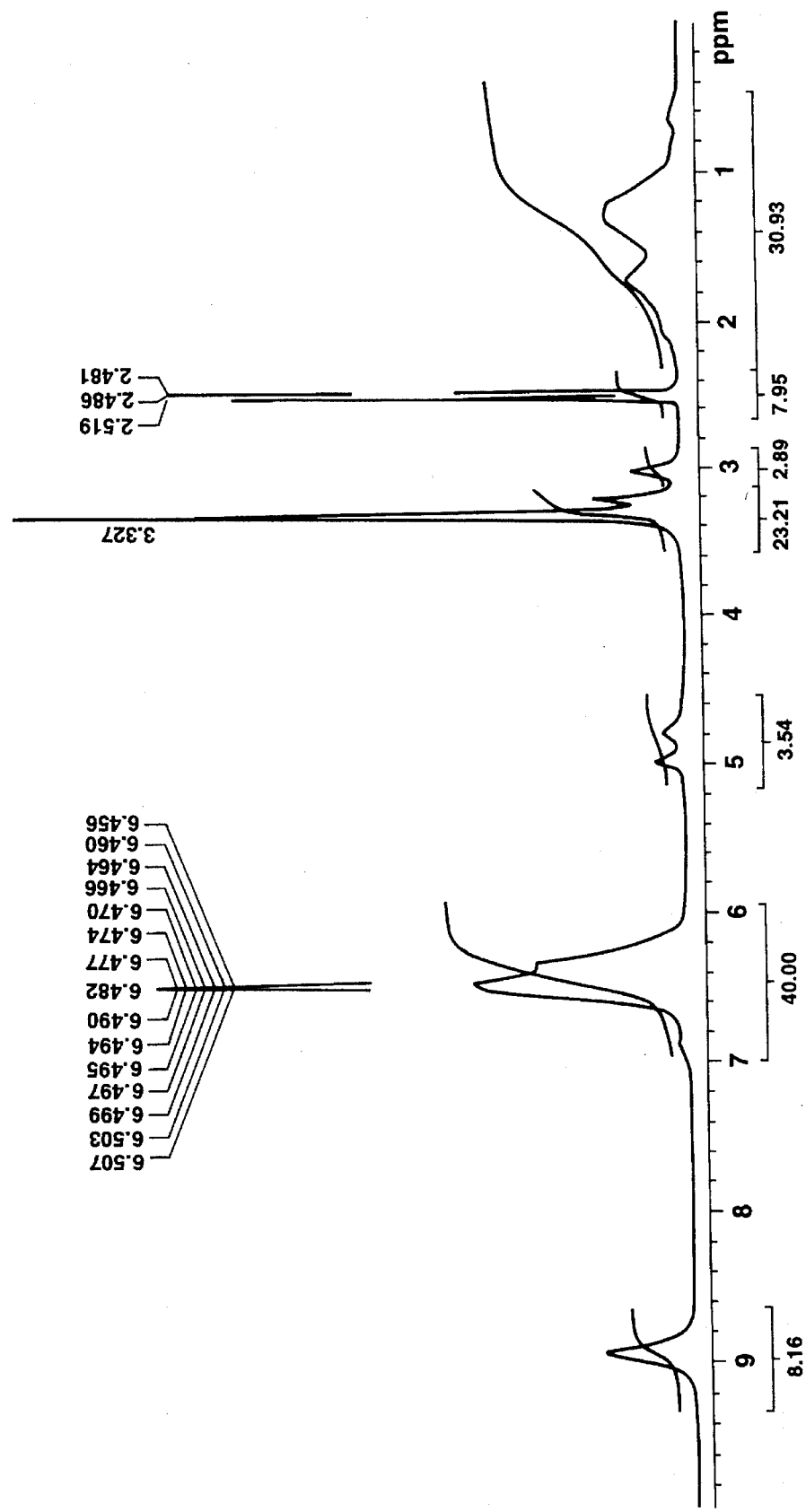
FIG. 4 is a $^1$H-NMR spectrum of the compound obtained in Example 1.

The polymer had a Mw of 9,600 and a dispersity Mw/Mn of 1.07. The polymer was analyzed by infrared (IR) absorption spectroscopy and proton-NMR spectroscopy, with the resulting spectra shown in FIGS. 3 and 4, respectively.

IR (KBr, cm$^{-1}$): 2922 (νC—H), 1544 (δC—H), 1099 (νC—O—C), 829 (triazine specific absorption)

PMR (300 MHz, in DMSO-d6, ppm): 0.8–2.1 (m, —CH—CH$_2$—), 3.3 (s, CH$_3$), 4.8–5.0 (d, —CH$_2$—), 6.1–6.8 (m, —C$_6$H$_4$—), 8.9 (s, —OH)

Example 2

A resist solution was prepared by dissolving 100 parts of the partially triazinylated polyhydroxystyrene polymer obtained in Example 1 and 8.75 parts of 2,4,6-tris-(trichloromethyl)-s-triazine as an acid generator in 625 parts of propylene glycol monoethyl ether acetate, and passing the mixture through a membrane filter with a pore size of 0.2 μm. The resist solution was spin coated onto a silicon wafer and pre-baked at 100° C. for 120 seconds to form a resist film of 1.0 μm thick. The resist film was exposed to light from a KrF (248 nm) excimer laser through a lens reduction projection aligner. The resist film as exposed was then baked at 80° C. for 60 seconds, developed with a 2.38% tetramethyl ammonium hydroxide aqueous solution for one minute, and washed with ultra-pure water for 30 seconds, forming a resist pattern. As a result, a line-and-space negative pattern having a resolution of 0.25 μm and a satisfactory rectangular profile was formed at an exposure of 15.0 mJ/cm$^2$.

Example 3

A resist solution was prepared as in Example 2 except that there was used 100 parts of a partially triazinylated polymer (triazinyl substitution 4.9 mol %) which was obtained from a polyhydroxystyrene resulting from radical polymerization (Mw=5,800, dispersity Mw/Mn=1.52) as in Example 1. A resist pattern was similarly formed therefrom. A line-and-space negative pattern having a resolution of 0.28 μm was formed at an exposure of 18.0 mJ/cm$^2$.

Example 4

A resist solution was prepared by dissolving 100 parts of the partially triazinylated polyhydroxystyrene polymer obtained in Example 1, 8.75 parts of 2,4,6-tris- (trichloromethyl)-s-triazine as an acid generator, and 15 parts of 2,4-bis(N,N-dimethoxymethyl)-6-phenyl-1,3,5-triazine as a crosslinking agent in 625 parts of propylene glycol monoethyl ether acetate, and passing the mixture through a membrane filter with a pore size of 0.2 μm. The resist solution was spin coated onto a silicon wafer and pre-baked at 100° C. for 120 seconds to form a resist film of 1.0 μm thick. The resist film was exposed to light from a KrF (248 nm) excimer laser through a lens reduction projection aligner. The resist film as exposed was then baked at 80° C. for 60 seconds, developed with a 2.38% tetramethyl ammonium hydroxide aqueous solution for one minute, and washed with ultra-pure water for 30 seconds, forming a resist pattern. As a result, a line-and-space negative pattern having a resolution of 0.25 μm and a satisfactory rectangular profile was formed at an exposure of 15.0 mJ/cm$^2$.

Comparative Example

A resist solution was prepared as in Example 4 except that there were used 100 parts of a polyhydroxystyrene resulting from radical polymerization (Mw=10,500, dispersity Mw/Mn=1.55) as the base polymer, 20 parts of commercially available hexamethoxymelamine (Cyme 11303, Mitsui-Cyanamide K.K.) as the crosslinking agent, and 5 parts of 2,4,6-tris(trichloromethyl)-s-triazine as the photo-acid generator. A resist pattern was similarly formed therefrom. A line-and-space negative pattern having a resolution of 0.34 μm was formed at an exposure of 17.0 mJ/cm$^2$.

Japanese Patent Application No. 209075/1995 is incorporated herein by reference.

While the invention has been described in connection with what is presently considered to be the most practical and preferred embodiment, it will be understood that the invention is not to be limited to the disclosed embodiment, but on the contrary, is intended to cover various modifications and equivalent changes included within the spirit and scope of the appended claims.

We claim:

1. A 2,4-diamino-s-triazinyl group-containing polymer consisting of 99 to 50 mol % of a unit of the following structural formula (1a) and 1 to 50 mol % of a unit of the following structural formula (1b):

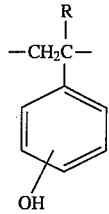
(1a)

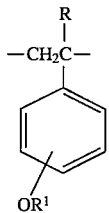
(1b)

wherein R is a hydrogen atom or methyl group, $R^1$ is a 2,4-diamino-s-triazinyl group of the following structural formula (2):

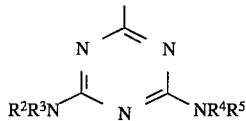
(2)

wherein at least one of $R^2$, $R^3$, $R^4$, and $R^5$ is an alkoxymethyl group of the structural formula: $-CH_2OR^6$ wherein $R^6$ is an alkyl group having 1 to 4 carbon atoms, and the remainder of $R^2$, $R^3$, $R^4$, and $R^5$ is a hydrogen atom, said polymer having a weight average molecular weight of 3,000 to 50,000.

2. The polymer of claim 1 which is a low dispersity polymer having a dispersity of 1.0 to 1.4 as represented by weight average molecular weight divided by number average molecular weight.

* * * * *